(12) United States Patent
Fukui et al.

(10) Patent No.: US 6,727,120 B2
(45) Date of Patent: Apr. 27, 2004

(54) WIRING METHOD IN LAYOUT DESIGN OF SEMICONDUCTOR INTEGRATED CIRCUIT, SEMICONDUCTOR INTEGRATED CIRCUIT AND FUNCTIONAL MACRO

(75) Inventors: Masahiro Fukui, Osaka (JP); Naoki Hayashi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/085,009

(22) Filed: Mar. 1, 2002

(65) Prior Publication Data

US 2002/0127782 A1 Sep. 12, 2002

(30) Foreign Application Priority Data

Mar. 7, 2001 (JP) .................................. 2001-063491

(51) Int. Cl.[7] .............................................. H01L 21/82
(52) U.S. Cl. .................................................. 438/129
(58) Field of Search ................................ 438/129, 598, 438/622

(56) References Cited

U.S. PATENT DOCUMENTS 6,522,011 B1 * 2/2003 Farrar ........................ 257/773
6,560,762 B2 * 5/2003 Kuwabara ................... 716/12

FOREIGN PATENT DOCUMENTS

JP        10-21280        1/1998

* cited by examiner

Primary Examiner—Huan Hoang
Assistant Examiner—Quoc Hoang
(74) Attorney, Agent, or Firm—McDermott, Will & Emery

(57) ABSTRACT

In placement of 6-bit interconnection lines in parallel, for example, interconnection lines for three lower-order bits having a high signal change frequency and interconnection lines for three higher-order bits having a low signal change frequency are placed alternately, so that each interconnection line for a lower-order bit is sandwiched by interconnection lines for higher-order bits. With this layout, the interconnection lines for higher-order bits serve like shield lines for the interconnection lines for lower-order bits. This effectively suppresses increase in delay in signal propagation due to change of a signal propagating through an interconnection line for a lower-order bit and a signal propagating through an interconnection line for a higher-order bit to opposite phases, without increasing the area.

11 Claims, 13 Drawing Sheets

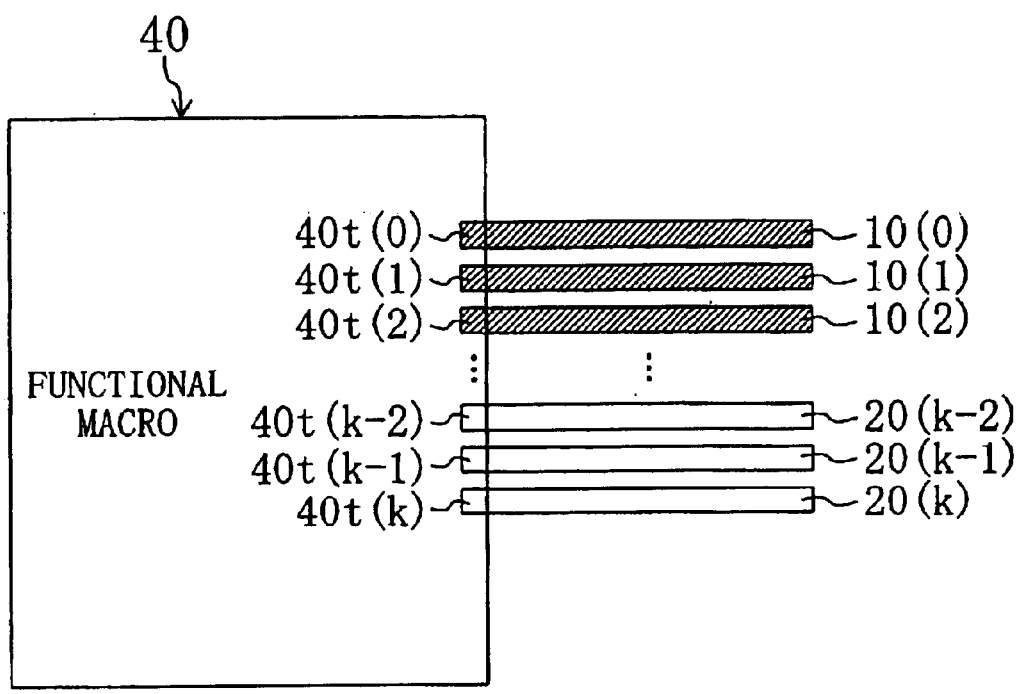

WIRING METHOD IN LAYOUT DESIGN OF SEMICONDUCTOR INTEGRATED CIRCUIT, SEMICONDUCTOR INTEGRATED CIRCUIT AND FUNCTIONAL MACRO

BACKGROUND OF THE INVENTION

The present invention relates to a wiring method in layout design of a semiconductor integrated circuit, a semiconductor integrated circuit having a plurality of interconnection lines, and a functional macro.

FIG. 17 schematically illustrates a portion of interconnection lines of a semiconductor integrated circuit placed by a conventional general wiring method. Referring to FIG. 17, the reference numeral 10(0) denotes a lower-order bit interconnection line for the 0-th bit as the least significant bit, 10(1) a lower-order bit interconnection line for the first bit, 10(2) a lower-order bit interconnection line for the second bit, 20(k) a higher-order bit interconnection line for the k-th bit as the most significant bit, 20(k−1) a higher-order bit interconnection line for the (k−1)th bit, and 20(k−2) a higher-order bit interconnection line for the (k−2)th bit. These interconnection lines are placed in the ascending order from the least significant 0-th bit or the descending order from the most significant bit. The spacing between the adjacent interconnection lines is set constant. In this placement, the lower-order bits run side by side while the higher-order bits run side by side.

FIG. 19 illustrates a configuration of a functional macro 40 such as a memory to which the k+1 bit interconnection lines 20(k) to 10(0) described above are connected. The functional macro 40 has k+1 terminals 40t(k) to 40t(0) connected to the k+1 bit interconnection lines 20(k) to 10(0) placed in the ascending order from the 0-th bit as the least significant bit (or the descending order from the k-th bit as the most significant bit). Therefore, the terminals 40t(k) to 40t(0) are also placed in the ascending order from the 0-th bit as the least significant bit (or the descending order from the k-th bit as the most significant bit). The k+1 terminals 40t(k) to 40t(0) as a whole transmit or receive information as one unit of data or one address.

FIG. 18 is a diagrammatic illustration of a capacitance between interconnection lines. When two interconnection lines 1 and 2 running in parallel with each other are assumed, a parasitic capacitance is inevitably generated between the two interconnection lines, which is herein called a wiring capacitance 3. When a digital signal on one of two interconnection lines changes from 0 to 1 while a digital signal on the other interconnection line changes in reverse, that is, from 1 to 0, it is called that these signals change to opposite phases. In the parallel interconnection lines 1 and 2 located close to each other, if the signals on these interconnection lines change to opposite phases, they both draw a charge existing in the parasitic capacitance (wiring capacitance 3) formed therebetween. This increases delay in signal propagation.

Semiconductor micro-fabrication technology has advanced at rapid paces. In the level of fine technology before attainment of 0.5 $\mu$m, the spacing between interconnection lines was large enough to only generate a small value of parasitic capacitance, and thus there was no occurrence of the problem of increase in signal delay described above. However, at attainment of the level as fine as about 0.35 $\mu$m and then about 0.25 $\mu$m, this problem began to arise locally in interconnections for high-speed propagation. After attainment of the level of 0.18 $\mu$m, this problem has become more significant every time the process is updated. In addition, since it is difficult to correctly grasp what operation the wiring capacitance causes, there has even occurred an unexpected design problem in some cases.

Conventionally, for solving the problem of increase in signal delay, the following techniques, for example, are employed when high-speed operation is required: setting a rule to secure a large spacing between adjacent interconnection lines; providing an additional shield line between adjacent interconnection lines; and twisting (intersecting) interconnection lines.

However, in any of the above techniques of securing a large spacing between interconnection lines, providing a shield line, and twisting interconnection lines, the problem is solved at the expense of increase in the area of the semiconductor integrated circuit. Moreover, when interconnection lines both on which a signal frequently changes (that is, high in signal change frequency) are placed in parallel with each other, the probability that both signals change to opposite phases simultaneously is high. In the conventional wiring method shown in FIG. 17, the lower-order bits tend to be higher in signal change frequency compared with the higher-order bits. Therefore, when interconnection lines for lower-order bits are placed in parallel close to each other as in the configuration shown in FIG. 17, there is significantly high probability that delay in signal propagation may increase due to simultaneous change of signals to opposite phases and this may cause a problem in operation of the semiconductor integrated circuit.

SUMMARY OF THE INVENTION

An object of the present invention is providing a wiring method in layout design of a semiconductor integrated circuit having a plurality of interconnection lines, capable of effectively suppressing delay in signal propagation due to signal interference between the plurality of parallel interconnection lines while minimizing increase in area, and a semiconductor integrated circuit and a functional macro capable of effectively suppressing interference between signals described above.

To attain the above object, according to the present invention, attention is paid to the fact that when a plurality of interconnection lines are provided, signals propagating through the interconnection lines are different in signal change frequency, in particular, in multi-bit interconnection lines, signal lines for higher-order bits are considerably low in signal change frequency compared with signal lines for lower-order bits. In view of this fact, these interconnection lines, as well as a plurality of terminals of a functional macro connected to these interconnection lines, may be suitably placed based on the change frequency of the signals propagating through these interconnection lines. By this placement, interference between the signals can be effectively suppressed.

The wiring method in layout design of a semiconductor integrated circuit of the present invention is a method for placing interconnection lines for a plurality of bits in parallel two-dimensionally or three-dimensionally in layout design of a semiconductor integrated circuit, wherein the interconnection lines for a plurality of bits are placed in an ascending or descending order of the bits, interconnection lines for bits of ordinal numbers equal to or more than a predetermined ordinal number are placed adjacent to each other at a predetermined spacing, and interconnection lines for bits of ordinal numbers less than the predetermined ordinal number are placed adjacent to each other at a spacing exceeding the predetermined spacing.

Alternatively, the wiring method in layout design of a semiconductor integrated circuit of the present invention is a method for placing interconnection lines in parallel two-dimensionally or three-dimensionally in layout design of a semiconductor integrated circuit, wherein a signal change frequency at which a signal propagating through an interconnection line changes per unit time is determined for each of the plurality of interconnection lines by estimation or simulation, and the plurality of interconnection lines are placed based on the signal change frequency so that interconnection lines having a high signal change frequency and interconnection lines having a low signal change frequency are adjacent to each other.

In the method described above, in the case of transmitting a signal of a plurality of bits via the plurality of interconnection lines, the plurality of interconnection lines may be placed based on the signal change frequency, irrespective of an ascending or descending order of the bits.

In the method described above, the plurality of interconnection lines may be placed so that interconnection lines having a high signal change frequency are sandwiched by interconnection lines having a low signal change frequency.

Alternatively, the wiring method in layout design of a semiconductor integrated circuit of the present invention is a method for placing interconnection lines for a plurality of bits in parallel two-dimensionally or three-dimensionally in layout design of a semiconductor integrated circuit, wherein in placement of the interconnection lines for a plurality of bits, one interconnection line for a bit of an ordinal number equal to or more than a predetermined ordinal number and an interconnection line for a bit of an ordinal number less than the predetermined ordinal number are placed adjacent to each other, and another interconnection line for a bit of an ordinal number equal to or more than the predetermined ordinal number and another interconnection line for a bit of an ordinal number less than the predetermined ordinal number are placed adjacent to each other, and this placement is repeated.

In the method described above, preferably, interconnection lines for bits are placed in a descending order from the most significant bit until a bit of the predetermined ordinal number in parallel two-dimensionally at a spacing double a predetermined spacing, and interconnection lines for bits are placed in an ascending order from the least significant bit in parallel two-dimensionally between the already-placed interconnection lines.

In the wiring method described above, the method may include the steps of: (1) placing an interconnection line for the least significant bit at a predetermined position; (2) placing interconnection lines for the two highest-order bits on the right and left sides of the interconnection line for the least significant bit; (3) placing interconnection lines for the remaining two lowest-order bits on the right and left sides of the interconnection lines for the two highest-order bits placed in the step (2); (4) placing interconnection lines for the remaining two highest-order bits on the right and left sides of the interconnection lines for the two lowest-order bits placed in the step (3); and (5) repeating the steps (3) and (4) until the interconnection lines for all the bits are placed.

Alternatively, the wiring method in layout design of a semiconductor integrated circuit of the present invention is a method for placing interconnection lines for a plurality of bits in parallel three-dimensionally in n wiring layers (n>2) in layout design of a semiconductor integrated circuit. The method includes the steps of: (1) placing an interconnection line for the least significant bit in a predetermined wiring layer; (2) placing interconnection lines for a plurality of highest-order bits in the same wiring layer as the interconnection line for the least significant bit and a different wiring layer so as to surround the interconnection line for the least significant bit placed in the step (1); (3) placing interconnection lines for a plurality of remaining lowest-order bits in the same wiring layers as the interconnection lines for a plurality of highest-order bits and a different wiring layer so as to surround the interconnection lines for a plurality of highest-order bits placed in the step (2); and (4) repeating the steps (2) and (3) until the interconnection lines for all the bits are placed.

In the method described above, preferably, the n wiring layers are two wiring layers, the interconnection line for the least significant bit is placed at a predetermined position of the lower wiring layer in the step (1), interconnection lines for the three highest-order bits are placed in the lower and upper wiring layers so as to be positioned on the right, left and upper sides of the interconnection line for the least significant bit in the step (2); interconnection lines for the remaining four lowest-order bits are placed in the lower and upper wiring layers so as to be positioned on the right and left sides of the interconnection lines for the three highest-order bits in the step (3), and the steps (2) and (3) are repeated until the interconnection lines for all the bits are placed in the step (4).

In the method described above, preferably, the n wiring layers are two wiring layers, the interconnection line for the least significant bit is placed at a predetermined position of the upper wiring layer in the step (1), interconnection lines for the three highest-order bits are placed in the upper and lower wiring layers so as to be positioned on the right, left and lower sides of the interconnection line for the least significant bit in the step (2); interconnection lines for the remaining four lowest-order bits are placed in the upper and lower wiring layers so as to be positioned on the right and left sides of the interconnection lines for the three highest-order bits in the step (3), and the steps (2) and (3) are repeated until the interconnection lines for all the bits are placed in the step (4).

In the method described above, preferably, the n wiring layers are three wiring layers, the interconnection line for the least significant bit is placed at a predetermined position of the center wiring layer in the step (1), interconnection lines for the four highest-order bits are placed in the center, lower and upper wiring layers so as to be positioned on the right, left, upper and lower sides of the interconnection line for the least significant bit in the step (2); interconnection lines for the remaining six lowest-order bits are placed in the center, lower and upper wiring layers so as to be positioned on the right and left sides of the interconnection lines for the four highest-order bits in the step (3), interconnection lines for the remaining six highest-order bits are placed in the center, lower and upper wiring layers so as to be positioned on the right and left sides of the interconnection lines for the six lowest-order bits in the step (4), and the steps (3) and (4) are repeated until the interconnection lines for all the bits are placed.

The semiconductor integrated circuit of the present invention is a semiconductor integrated circuit having interconnection lines for a plurality of bits placed in an ascending or descending order of the bits in parallel two-dimensionally or three-dimensionally, wherein the spacing between interconnection lines for bits of ordinal numbers less than a predetermined ordinal number is larger than the spacing between interconnection lines for bits of ordinal numbers equal to or more than the predetermined ordinal number.

Alternatively, the semiconductor integrated circuit of the present invention is a semiconductor integrated circuit having a plurality of interconnection lines placed in parallel two-dimensionally or three-dimensionally, wherein the plurality of interconnection lines are not arranged in an ascending or descending order of a signal change frequency at which a signal propagating through an interconnection line changes.

In the semiconductor integrated circuit described above, preferably, the plurality of interconnection lines are interconnection lines for a plurality of bits, and the interconnection lines for a plurality of bits are placed in an order irrespective of an ascending or descending order of the bits.

In the semiconductor integrated circuit described above, an interconnection line having a high signal change frequency is preferably sandwiched by two interconnection lines having a low signal change frequency.

In the semiconductor integrated circuit described above, the width of the plurality of interconnection lines is preferably 0.18 µm or less.

In the semiconductor integrated circuit described above, the plurality of interconnection lines may be a plurality of address bus lines.

In the semiconductor integrated circuit described above, signals propagating through the plurality of interconnection lines may be digital signals of an image or voice.

Alternatively, the semiconductor integrated circuit of the present invention is a semiconductor integrated circuit including: a plurality of interconnection lines; a processing circuit for performing predetermined processing and outputting signals of results of the predetermined processing to the plurality of interconnection lines; and switch means disposed between the plurality of interconnection lines and the processing circuit for changing the order of arrangement of the signals output from the processing circuit so that the signals are not arranged in an ascending or descending order of a signal change frequency and transmitting the signals in the changed order to the plurality of interconnection lines.

The semiconductor integrated circuit described above may further include: a receiver circuit for receiving the signals transmitted through the plurality of interconnection lines; and second switch means disposed between the plurality of interconnection lines and the receiver circuit for changing the order of arrangement of the signals transmitted through the plurality of interconnection lines to the ascending or descending order of the signal change frequency and transmitting the signals in the changed order to the receiver circuit.

The functional macro of the present invention is a functional macro having a plurality of terminals to which interconnection lines for a plurality of bits are connected, wherein the plurality of terminals are placed in an ascending or descending order of the bits, the spacing between terminals for higher-order bits among the plurality of terminals is set at a predetermined spacing, and the spacing between terminals for lower-order bits among the plurality of terminals is set at a spacing larger than the predetermined spacing.

Alternatively, the functional macro of the present invention is a functional macro having a plurality of terminals to which interconnection lines for a plurality of bits are connected, wherein the order of arrangement of the plurality of terminals does not depend on an ascending or descending order of the bits, but is set based on a change frequency of signals input into or output from the terminals.

In the functional macro described above, preferably, the plurality of terminals are placed so that a terminal having a high signal change frequency is sandwiched by terminals having a low signal change frequency.

In the functional macro described above, preferably, terminals for higher-order bits of ordinal numbers equal to or more than a predetermined ordinal number are placed in a descending order from the most significant bit at a spacing double a predetermined spacing, and terminals for lower-order bits of ordinal numbers less than the predetermined ordinal number are placed in an ascending order from the least significant bit between the terminals for the higher-order bits starting from the side of the terminal for the most significant bit.

In the functional macro described above, terminals for given two bits continuous from the least significant position may be placed on the inner or outer sides of terminals for given two bits continuous from the most significant position.

In the functional macro described above, preferably, two terminals for the two highest-order bits are placed on both ends, and two terminals for the two lowest-order bits are placed on the inner sides of the two terminals for the two highest-order bits.

In the functional macro described above, a terminal for the least significant bit is preferably placed on the center of the plurality of terminals placed.

Alternatively, the semiconductor integrated circuit of the present invention is a semiconductor integrated circuit including: a functional macro having a plurality of terminals arranged in an ascending or descending order of bits, other terminals identical in number to the plurality of terminals placed in correspondence with the plurality of terminals, the other terminals being arranged in an order based on a signal change frequency; and a terminal sorting block for connecting the plurality of terminals of the functional macro to the other terminals.

In the semiconductor integrated circuit described above, the functional macro, the other terminals and the terminal sorting block may be formed integrally.

In the functional macro described above, the functional macro may be a memory, an operator or a CPU.

Alternatively, the wiring method of the present invention is a wiring method in layout design of a semiconductor integrated circuit, wherein a plurality of interconnection lines are connected to the plurality of terminals of the functional macro described above, and an interconnection line on which a signal changes frequently among the plurality of interconnection lines is sandwiched by two interconnection lines on which a signal changes less frequently.

Alternatively, the semiconductor integrated circuit of the present invention is a semiconductor integrated circuit including, two or more functional macros described above; and a plurality of interconnection lines for connecting the plurality of terminals of the functional macros to each other, wherein an interconnection line on which a signal changes frequently among the plurality of interconnection lines is sandwiched by two interconnection lines on which a signal changes less frequently.

In the semiconductor integrated circuit described above, preferably, three or more functional macros are provided, and the plurality of interconnection lines are address bus lines for a plurality of bits.

In the semiconductor integrated circuit described above, preferably, two functional macros are provided, one of the two functional macros being an A/D converter, and the plurality of interconnection lines are data signal interconnection lines for transmitting a digital signal output from the A/D converter by converting an analog value to a digital value.

Thus, according to the present invention, in placement of interconnection lines for a plurality of bits in the ascending or descending order of the bits, the spacing between interconnection lines for lower-order bits of ordinal numbers less than a predetermined ordinal number having a high signal change frequency is set large so that the wiring capacitance between the interconnection lines is small. This effectively suppresses or eliminates a problem in operation of a semiconductor integrated circuit that may occur due to increase in delay caused by change of signals to opposite phases between the interconnection lines. Moreover, the spacing between interconnection lines for higher-order bits of ordinal numbers equal to or more than the predetermined ordinal number having a low signal change frequency is set smaller than the above largely-set spacing. This effectively suppresses increase in the area of the semiconductor integrated circuit compared with the case of setting the large spacing for all the interconnection lines.

According to the present invention, in placement of a plurality of interconnection lines, interconnection lines having a high signal change frequency and interconnection lines having a low signal change frequency are placed to be adjacent to each other. Therefore, the interconnection lines having a low signal change frequency serve like shield lines for the interconnection lines having a high signal change frequency. This also minimizes the probability that signals on two interconnection lines may change to opposite phases. As a result, it is possible to effectively suppress or eliminate a problem in operation of a semiconductor integrated circuit that may occur due to change of signals to opposite phases between interconnection lines having a high signal change frequency. Since only the order of arrangement of signals propagating through the plurality of interconnection lines is changed, undesired increase in the area of the semiconductor integrated circuit is prevented.

According to the present invention, once an auto placing and routing tool grasps the order of arrangement of terminals of a functional macro, automatic layout of interconnection lines for lower-order bits and interconnection lines for higher-order bits in the order of arrangement of the terminals is possible by normal automatic routing using the auto placing and routing tool. Therefore, the interconnection lines having a low signal change frequency serve like shield lines for the interconnection lines having a high signal change frequency, and increase in delay in signal propagation due to signal interference can be effectively suppressed without undesired increase in the area of the entire semiconductor integrated circuit.

BRIEF DESCRIPTION OF THE DRAWINGS

FIG. 19 is a block diagram of a conventional functional macro.

DESCRIPTION OF THE PREFERRED EMBODIMENTS

Hereinafter, preferred embodiments of the present invention will be described with reference to the accompanying drawings.

Embodiment 1

First, a difference in behavior between a signal of a higher-order bit and a signal of a lower-order bit will be described for some types of signals.

As bus signals, typical types are: (a) completely random control bus signals; (b) address bus signals for controlling sequential processing of a program and access to data by a computer, (c) analog/digital converted information of an image, music and the like, and (d) digital-coded data of the transition state and the like in a sequential machine. Among these, types (b) and (c) make up a major proportion. The bus signals of types (b) and (c) clearly have a difference in signal change frequency between bits. As for address bus signals in type (b), when processing of a program by a computer is taken as an example, about 80 to 90% of instruction codes are related to sequential accessing to continuous addresses. An exception is branching instruction. However, since the range of addresses within which a program is stored is limited, there will be no access beyond this range even in this instruction. An address bus is represented by a binary number. Therefore, in the case of continuous address change or address change within a limited range, lower-order bits have a higher probability of signal change. This can be proved mathematically.

As for information on an image (composed of brightness, tint and the like) and voice (composed of frequency, volume, and the like) in type (c), information watched or listened on a TV set or a stereo is low in probability that an abrupt change in analog value may occur in a short time period (for example, for one clock time). A change in a short time period is not recognized by the human senses, but merely considered as noise. Therefore, in the case of type (c), as in the case of type (b), the change in value is within a considerably limited range. Thus, in this case, also, lower-order bits have a higher probability of signal change As for types (a) and (d) above, the signal change frequency is roughly the same for all bits, and therefore the present invention is not applicable to these types of signals.

In view of the above, in Embodiments 1 to 8 to be discussed hereinafter, the plurality of interconnection lines are preferably a plurality of address bus lines, and the signals propagating through these interconnection lines are preferably digital signals of an image or voice. The width of the plurality of interconnection lines is not specifically limited. A large width can be adopted to implement the present invention. However, when the width of the interconnection lines is 0.18 µm or less, the effect of the present invention is exhibited so significantly that occurrence of an unexpected design problem can be effectively suppressed.

Figure 1:
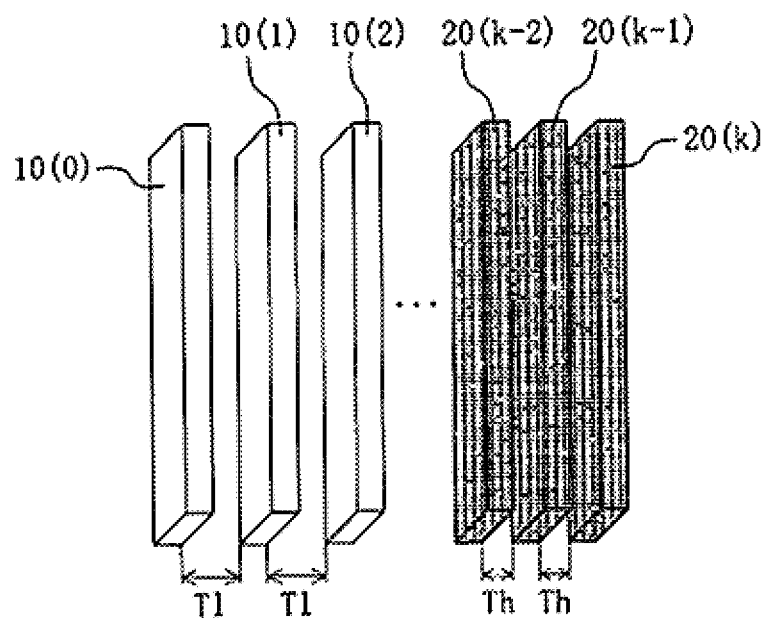
FIG. 1 is a diagrammatic illustration of a wiring method and a semiconductor integrated circuit of Embodiment 1 of the present invention.

FIG. 1 schematically illustrates a wiring method and a semiconductor circuit of Embodiment 1 of the present invention. Referring to FIG. 1, the reference numeral 10(0) denotes a lower-order bit interconnection line for the 0-th bit as the least significant bit, 10(1) a lower-order bit interconnection line for the first bit, 10(2) a lower-order bit interconnection line for the second bit, 20(k) a higher-order bit interconnection line for the k-th bit as the most significant bit, 20(k−1) a higher-order bit interconnection line for the (k−1)th bit, and 20(k−2) a higher-order bit interconnection line for the (k−2)th bit. These interconnection lines are placed in the ascending order from the least significant 0-th bit or the descending order from the most significant bit.

The spacing of the plurality of (k+1) interconnection lines is set at a predetermined spacing Th for the interconnection lines for the higher-order bits 20(k), 20(k−1), . . . , and at a predetermined spacing T1, which is larger than the spacing Th, for the interconnection lines for the lower-order bits 10(0), 10(1), . . . .

The number of interconnection lines to be used for the lower-order bits, or to state differently, the ordinal number of the interconnection line serving as the border between the lower-order bits and the higher-order bits is determined in the following manner. That is, an interconnection line for a bit of a certain ordinal number at which the signal change frequency exceeds a predetermined value is selected as the border interconnection line, although this depends on an expected data (signal) distribution. The signal change frequency (rate of change of a signal on each interconnection line per unit time) can be estimated, by statistical analysis of a signal propagating through each interconnection line, from the distribution of values obtained and the distribution of the ranges within which the values change after one clock. It may also be determined by simulation.

In this embodiment, the wiring capacitance between interconnection lines for lower-order bits can be made small. Therefore, it is possible to reduce the probability that a problem may occur in operation of the semiconductor integrated circuit due to increase in delay caused by simultaneous change of signals to opposite phases.

In the conventional configuration where the spacing between interconnection lines is large for all the interconnection lines, the degree of increase in the area for the interconnection lines is large. In this embodiment, however, the spacing is large only for the interconnection lines for lower-order bits having a high signal change frequency, and thus the increase in the area of the semiconductor integrated circuit can be minimized.

Embodiment 2

Figure 2:
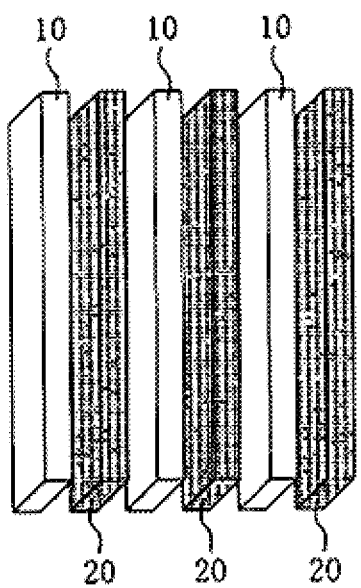
FIG. 2 is a diagrammatic illustration of a wiring method and a semiconductor integrated circuit of Embodiment 2 of the present invention.

FIG. 2 schematically illustrates a wiring method and a semiconductor integrated circuit of Embodiment 2 of the present invention. In this embodiment, respective interconnection lines 10 for lower-order bits having a high signal change frequency are sandwiched by interconnection lines 20 for higher-order bits having a low signal change frequency.

In this embodiment, therefore, the interconnection lines 20 for higher-order bits having a low signal change frequency serve as shields for the interconnection lines 10 for lower-order bits having a high signal change frequency, and as a result, increase in delay in signal propagation can be minimized.

Embodiment 3

Figure 3:
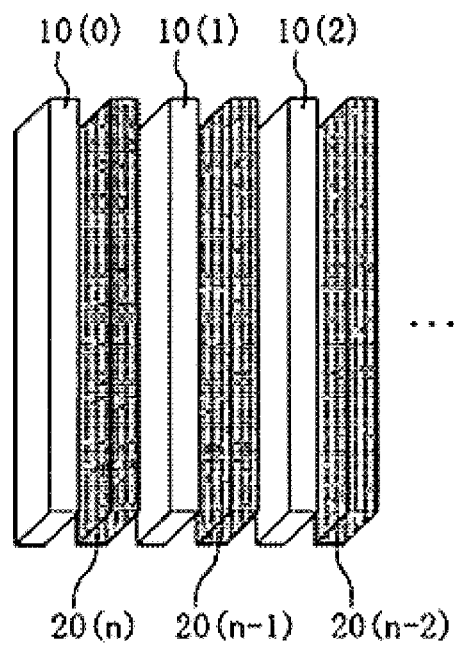
FIG. 3 is a diagrammatic illustration of a wiring method and a semiconductor integrated circuit of Embodiment 3 of the present invention.

FIG. 3 schematically illustrates a wiring method and a semiconductor integrated circuit of Embodiment 3 of the present invention. In this embodiment, interconnection lines 10(0), 10(1), 10(2), . . . for the 0-th bit as the least significant bit, the first bit, the second bit, . . . are placed in parallel in the ascending order at a spacing double a predetermined spacing two-dimensionally. After placement of an interconnection line for a lower-order bit of a predetermined ordinal number is finished, interconnection lines 20(n), 20(n−1), 20(n−2), . . . for the n-th bit as the most significant bit, the (n−1)th bit, the (n−2)th bit, . . . are placed in parallel in the descending order at respective center positions between the adjacent interconnection lines for the lower-order bits two-dimensionally.

In this embodiment, the respective interconnection lines 10(0), 10(1), . . . for the lower-order bits having a high signal change frequency are sandwiched by the interconnection lines 20(n), 20(n−1), . . . for the higher-order bits having a low signal change frequency. Therefore, the interconnection lines 20(n), 20(n−1), . . . serve as shields for the interconnection lines 10(0), 10(1), . . . , and as a result, increase in delay in signal propagation can be minimized.

In this embodiment, the interconnection lines for the lower-order bits were first placed and the interconnection lines for the higher-order bits were interposed between the above interconnection lines. Naturally, the placement may be in reverse order. That is, the interconnection lines for the higher-order bits may be first placed and the interconnection lines for the lower-order bits may be interposed between the above interconnection lines.

Embodiment 4

Figure 4:
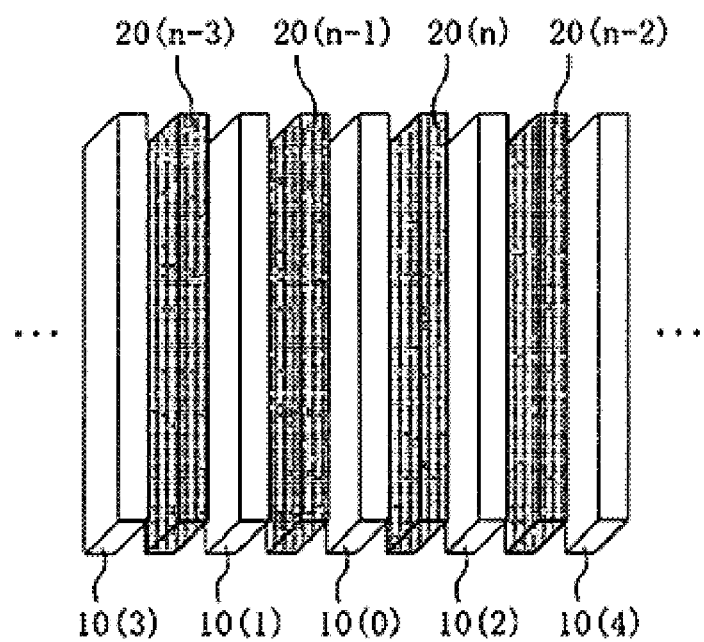
FIG. 4 is a diagrammatic illustration of a wiring method and a semiconductor integrated circuit of Embodiment 4 of the present invention.

FIG. 4 schematically illustrates a wiring method and a semiconductor integrated circuit of Embodiment 4 of the present invention. In this embodiment, the interconnection line 10(0) for the 0-th bit as the least significant bit is first placed at a predetermined position such as the center position. Subsequently, the interconnection lines 20(n) and 20(n−1) for the n-th bit as the most significant bit and the (n−1)th bit are placed on the right and left sides of the interconnection line 10(0) for the 0-th bit at a predetermined spacing. The interconnection lines 10(1) and 10(2) for the first and second bits as the remaining two lowest-order bits are placed on the left and right sides of the interconnection lines 20(n) and 20(n−1) for the higher-order bits at the predetermined spacing. Subsequently, the interconnection lines 20(n–2) and 20(n–3) for the (n–2)th and (n–3)th bits as the remaining two highest-order bits are placed on the right and left sides of the interconnection lines 10(1) and 10(2) for the lower-order bits at the predetermined spacing. Likewise, the interconnection lines 10(3) and 10(4) for the third and fourth bits as the remaining two lowest-order bits are placed on the left and right sides of the interconnection lines 20(n–2) and 20(n–3) for the higher-order bits at the predetermined spacing. In this way, the interconnection lines for the remaining two highest-order bits and the interconnection lines for the remaining two lowest-order bits are repeatedly placed alternately until placement of the interconnection lines for all the bits is completed.

In this embodiment, therefore, as in Embodiment 3, the respective interconnection lines for the lower-order bits having a high signal change frequency are sandwiched by the interconnection lines for the higher-order bits having a low signal change frequency. The interconnection lines for the higher-order bits therefore serve as shields for the interconnection lines for the lower-order bits, and as a result, increase in delay in signal propagation can be minimized.

Embodiment 5

Figure 5:
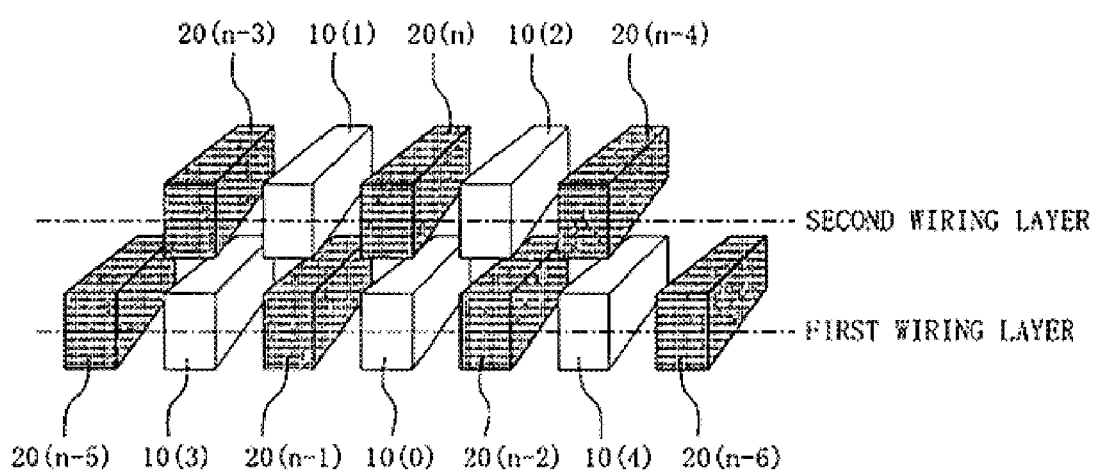
FIG. 5 is a diagrammatic illustration of a wiring method and a semiconductor integrated circuit of Embodiment 5 of the present invention.

FIG. 5 schematically illustrates a wiring method and a semiconductor integrated circuit of Embodiment 5 of the present invention. In this embodiment, interconnection lines are placed in parallel three-dimensionally in the form of two wiring layers.

Referring to FIG. 5, the interconnection line 10(0) for the least significant bit is first placed at a predetermined position such as the center position of a first wiring layer as the lower layer. Subsequently, the interconnection lines 20(n), 20(n–1) and 20(n–2) for the n-th bit, the (n–1)th bit and the (n–2)th bit as the three highest-order bits are placed at a position of an upper layer (second wiring layer) right above the interconnection line 10(0) for the least significant bit and positions on the left and right sides of the interconnection line 10(0), respectively. The interconnection lines 10(1) to 10(4) for the first to fourth bits as the remaining four lowest-order bits are then placed on the left and right sides of the interconnection lines 20(n), 20(n–1) and 20(n–2) for the higher-order bits of the first and second wiring layers. Likewise, the interconnection lines 20(n–3) to 20(n–6) for the (n–3)th to (n–6)th bits as the remaining four highest-order bits are placed on the left and right sides of the interconnection lines 10(1) to 10(4) for the lower-order bits of the first and second wiring layers. In this way, the interconnection lines for the remaining four highest-order bits and the interconnection lines for the remaining four lowest-order bits are repeatedly placed alternately until placement of the interconnection lines for all the bits is completed.

In this embodiment, therefore, as in the previous embodiments, the interconnection lines for the higher-order bits serve as shields for the interconnection lines for the lower-order bits, and as a result, increase in delay in signal propagation can be minimized.

Embodiment 6

Figure 6:
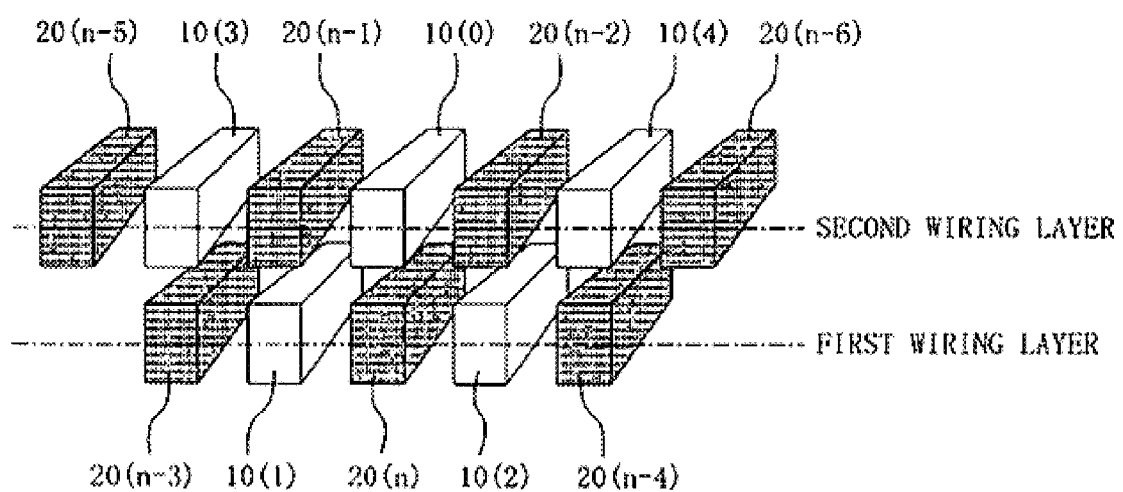
FIG. 6 is a diagrammatic illustration of a wiring method and a semiconductor integrated circuit of Embodiment 6 of the present invention.

FIG. 6 schematically illustrates a wiring method and a semiconductor integrated circuit of Embodiment 6 of the present invention. This embodiment is different from Embodiment 5 in that while the interconnection line 10(0) for the least significant bit was first placed at a position of the first wiring layer in Embodiment 5, it is placed at a position of the second wiring layer in this embodiment. The wiring method for the other interconnection lines is the same as that of Embodiment 5, and thus description thereof is omitted here. In this embodiment, substantially the same function and effect as those in Embodiment 5 are obtained.

Embodiment 7

Figure 7:
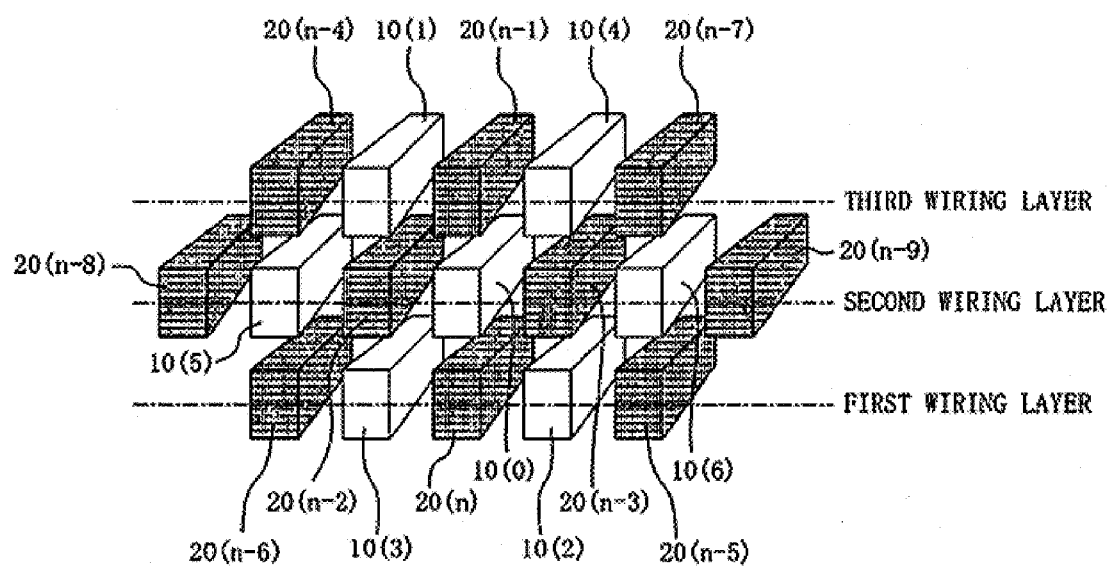
FIG. 7 is a diagrammatic illustration of a wiring method and a semiconductor integrated circuit of Embodiment 7 of the present invention.

FIG. 7 schematically illustrates a wiring method and a semiconductor integrated circuit of Embodiment 7 of the present invention. In this embodiment, interconnection lines are placed in parallel three-dimensionally in the form of three wiring layers.

Referring to FIG. 7, the interconnection line 10(0) for the 0-th bit as the least significant bit is first placed at a predetermined position such as the center position of a second wiring layer as the center layer. Subsequently, the interconnection line 20(n) for the n-th bit as the most significant bit is placed at a position of a first layer right below the interconnection line 10(0), the interconnection line 20(n–1) for the (n–1)th bit is placed at a position of a third layer right above the interconnection line 10(0), and the interconnection lines 20(n–2) and 20(n–3) for the (n–2)th and (n–3)th bits are placed at positions on the left and right sides of the interconnection line 10(0) of the second wiring layer.

Subsequently, the interconnection lines 10(1) to 10(6) for the first to sixth bits as the remaining six lowest-order bits are placed on the left and right sides of the interconnection lines 20(n) to 20(n–3) for the higher-order bits of the first to third wiring layers. Likewise, the interconnection lines 20(n–4) to 20(n–9) for the (n–4)th to (n–9)th bits as the remaining six highest-order bits are disposed on the left and right sides of the six interconnection lines 10(1) to 10(6) for the lower-order bits of the first to third wiring layers. In this way, the interconnection lines for the remaining six highest-order bits and the interconnection lines for the remaining six lowest-order bits are repeatedly placed alternately so as to surround the already-placed interconnection lines until placement of the interconnection lines for all the bits is completed.

In this embodiment, therefore, as in Embodiment 5, the interconnection lines for the lower-order bits having a high signal change frequency are sandwiched by the interconnection lines for the higher-order bits having a low signal change frequency in the three-layer structure, allowing the latter interconnection lines to serve as shields for the former interconnection lines. As a result, increase in delay in signal propagation can be minimized.

The wiring methods for placing interconnection lines in two and three layers were described. Naturally, the present invention is also applicable to placement of interconnection lines in parallel three-dimensionally in four or more layers (n layers where n>4). That is, the interconnection line for the 0-th bit as the least significant bit is first placed at a position of a vertically-center wiring layer among the n wiring layers. Interconnections for the four highest-order bits are then placed at four positions surrounding the interconnection line for the 0-th bit vertically and laterally. Subsequently, interconnection lines for the eight lowest-order bits are placed at positions of the wiring layers surrounding the four interconnection lines for the higher-order bits vertically and laterally. By repeating the above operation, placement of the interconnection lines for all the bits is completed.

Embodiment 8

Figure 8:
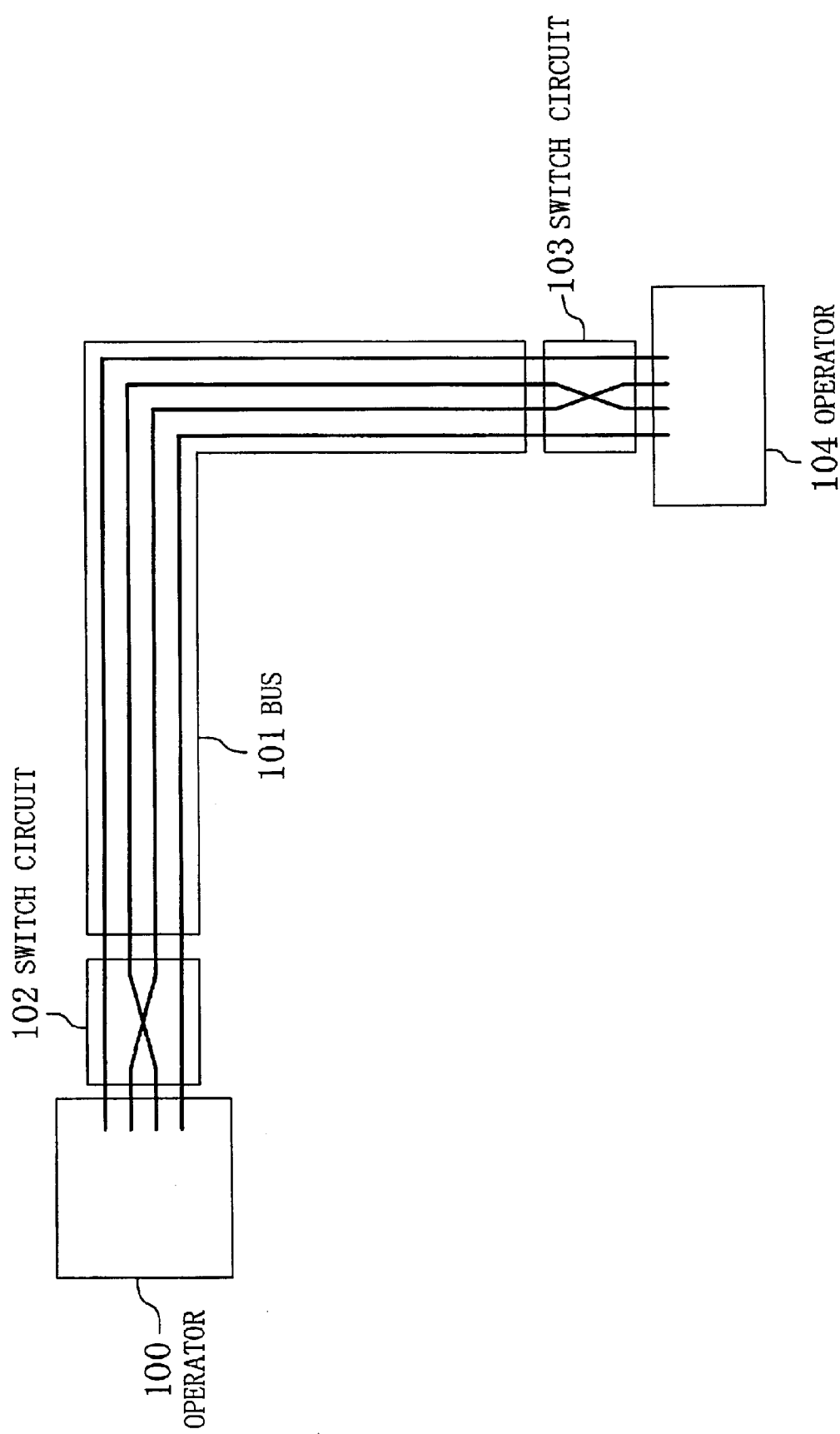
FIG. 8 is a block diagram of a semiconductor integrated circuit of Embodiment 8 of the present invention.

FIG. 8 is a block diagram of a semiconductor integrated circuit of Embodiment 8 of the present invention.

The semiconductor integrated circuit of this embodiment includes an operator (processing circuit) 100 for performing an operation as predetermined processing, a bus 101 having a plurality of lines (four in the illustrated example), and a switch circuit (switch means) 102 disposed between the operator 100 and an end of the bus 101.

A 4-bit operation result obtained in the operator 100 is sent to the bus 101 via the switch circuit 102. The switch circuit 102 changes the order of arrangement of bit signals of the 4-bit operation result from the operator 100 so that the bit signals are not in the ascending or descending order of the signal change frequency. That is, it is ensured that after the sorting, bus lines for signals having a high signal change frequency are not adjacent to each other. The operation result signals sorted as described above are then sent to the bus 101. Specific examples of the sorting of the signals adopted by the switch circuit 102 are as described in Embodiment 1 to 7 above.

The operation result signals that have propagated to the other end of the bus 101 are received by another operator (receiver circuit) 104 via another switch circuit (switch means) 103, to be subjected to an operation by the operator 104. The switch circuit 103 changes the order of arrangement of the 4-bit operation result signals to the ascending or descending order of the signal change frequency, which is the original order of the 4-bit output signals from the operator 100, and sends the operation result signals in the original order to the operator 104.

In this embodiment, the switch circuit 102 changes the order of arrangement of the signals propagating through the lines of the bus 101. Therefore, it is not necessary to change the configuration of the bus 101, and thus a conventional bus can be used as the bus 101. Moreover, the signals that have propagated through the lines of bus 101 are sorted back to the original order, and then input into the operator 104 in the normal bit order. The operator 104 therefore can perform an operation as initially intended.

Embodiment 9

Figure 9:
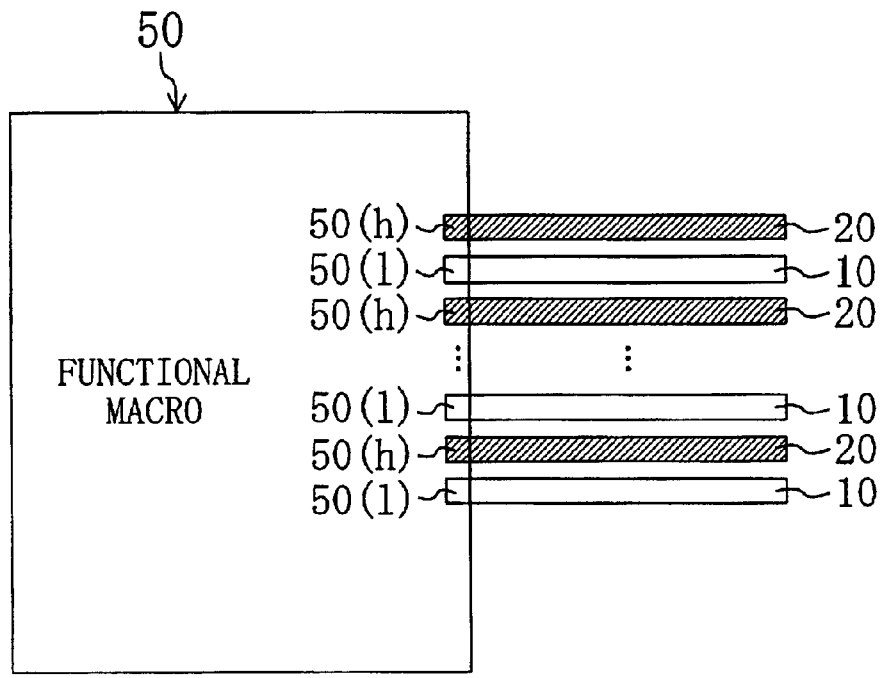
FIG. 9 is a block diagram of a functional macro of Embodiment 9 of the present invention.

FIG. 9 shows a functional macro of Embodiment 9 of the present invention. In this embodiment, the order of arrangement of a plurality of terminals of a functional macro connected to the plurality of interconnection lines described above is set to match with the order of arrangement of the plurality of interconnection lines.

Specifically, in FIG. 9, placement of interconnection lines is as described in Embodiment 2, where interconnection lines are intended to be placed based on the signal change frequency so that the plurality of interconnection lines 10 for the lower-order bits are sandwiched by the plurality of interconnection lines 20 for the higher-order bits. In this case, a plurality of terminals 50(h) and 50(1) of a functional macro 50, which constitutes a CPU, an SRAM, an operator or the like, are placed in advance to correspond to the order of arrangement of the plurality of interconnection lines 10 and 20. That is, the terminals 50(1) connected to the interconnection lines 10 for the lower-order bits are placed to be located between the terminals 50(h) connected to the interconnection lines 20 for the higher-order bits. The functional macro 50 is a novel functional macro of which the terminals are not arranged in the ascending or descending order of bits. The terminals 50(h) and 50(1) may be placed at equal spacing or at different spacing, both of which are within the scope of the present invention. This also applies to Embodiment 10 and the subsequent embodiments to follow.

Therefore, in this embodiment, when it is intended to adopt a layout structure that a plurality of interconnection lines 10 for lower-order bits having a high signal change frequency are sandwiched by a plurality of interconnection lines 20 for higher-order bits having a low signal change frequency, the terminals 50(h) and 50(1) of the functional macro 50 are placed in advance based on the signal change frequency in correspondence with the order of arrangement of the interconnection lines 10 and 20 described above. Thus, once an auto placing and routing tool grasps the order of arrangement of the terminals 50(h) and 50(1) of the functional macro 50, automatic layout of the interconnection lines 10 for lower-order bits and the interconnection lines 20 for higher-order bits in the order of arrangement described above is possible using the auto placing and routing tool. No design change is required for the auto placing and routing tool.

Embodiment 10

A functional macro of Embodiment 10 of the present invention will be described with reference to FIG. 10. In this embodiment, a specific example of the order of arrangement of a plurality of interconnection lines and the order of arrangement of a plurality of terminals of the functional macro is discussed.

Figure 10:
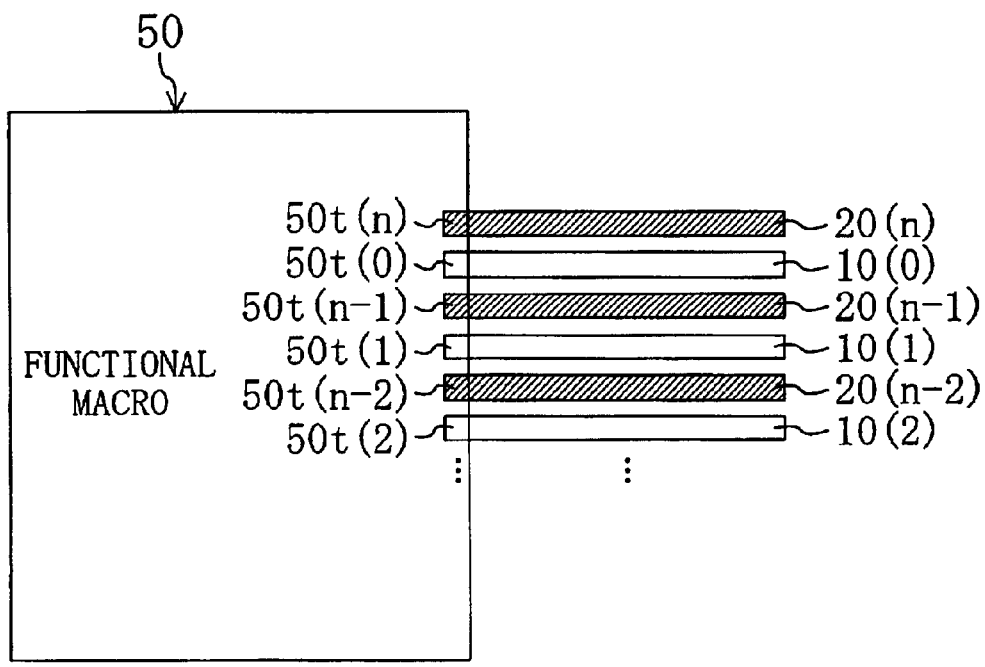
FIG. 10 is a block diagram of a functional macro of Embodiment 10 of the present invention.

That is, in FIG. 10, interconnection lines 20(n), 20(n–1), 20(n–2), . . . for the n-th bit as the most significant bits, the (n–1)th bit, the (n–2)th bit, are placed in the descending order from the top downward as is viewed from the figure at a spacing double a normal wiring spacing, and interconnection lines 10(0), 10(1), 10(2), . . . for the 0-th bit as the least significant bit, the first bit, the second bit, . . . are placed in the ascending order from the top downward as is viewed from the figure between the interconnection lines 20(n), 20(n–1), . . . for the higher-order bits.

In the functional macro 50, a plurality of terminals 50t(n), 50t(0), 50t(n–1), 50t(1), 50t(n–2), 50t(2), . . . are placed in the order of the n-th bit, the 0-th bit, the (n–1)th bit, the first bit, the (n–2)th bit, the second bit, from the top downward as is viewed from the figure, that is, in a order in which a terminal for a lower-order bit is sandwiched by terminals for two higher-order bits, in correspondence with the order of arrangement of the interconnection lines 10 and 20.

Therefore, in this embodiment, as in Embodiment 9, automatic layout of the interconnection lines 10 and 20 for lower-order and higher-order bits in the order of arrangement described above, not in the ascending or descending order of bits, is possible without the necessity of design change of the auto placing and routing tool.

Embodiment 11

A functional macro of Embodiment 11 of the present invention will be described with reference to FIG. 11. In this embodiment, the order of arrangement of a plurality of terminals of the functional macro is changed in a different way from that in Embodiment 10.

Figure 11:
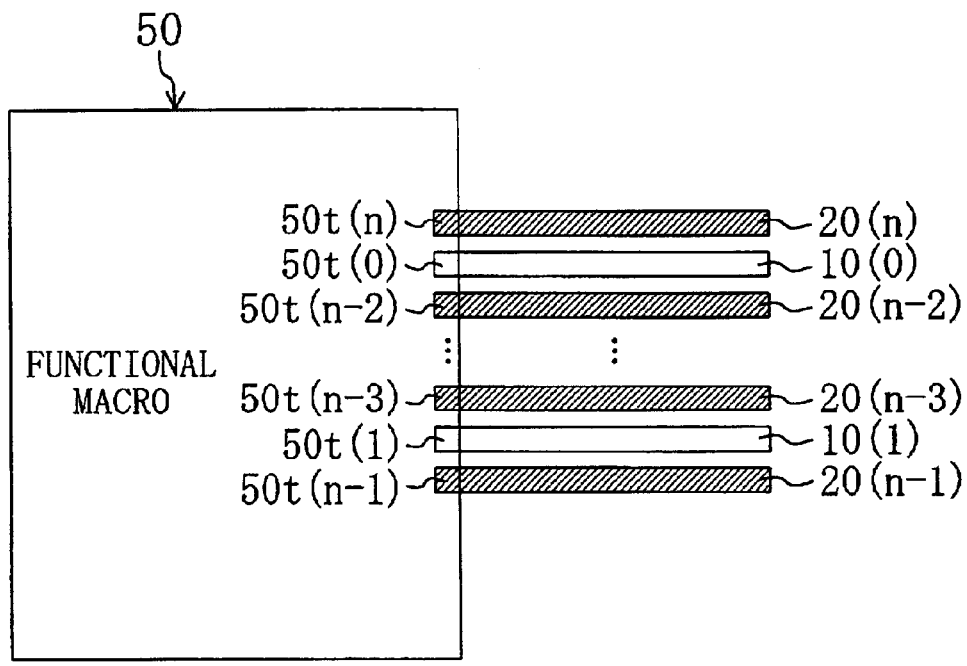
FIG. 11 is a block diagram of a functional macro of Embodiment 11 of the present invention.

That is, referring to FIG. 11, the interconnection lines 20(n) and 20(n–1) for the n-th bit and the (n–1)th bit as the two highest-order bits are placed at the outermost ends. The interconnections 10(0) and 10(1) for the 0-th bit and the first bit as the two lowest-order bits are then placed on the inner sides of the interconnection lines 20(n) and 20(n–1), respectively. Likewise, the interconnection lines 20(n–2) and 20(n–3) for the (n–2)th and (n–3)th bits as the remaining two highest-order bits are placed on the inner sides of the interconnection lines 10(0) and 10(1), respectively. In this way, by repeatedly placing interconnection lines for higher-order bits and interconnection lines for lower-order bits alternately on the inner sides of the previously-placed interconnection lines, all of the n+1 interconnection lines are placed.

In the functional macro 50, the terminals 50$t$(n), 50$t$(0), 50$t$(n−2), . . . for the n-th bit, the 0-th bit, the (n−2)th bit, . . . are placed from the top downward as is viewed from the figure, and the terminals 50$t$(n−1), 50$t$(1), 50$t$(n−3), . . . for the (n−1)th bit, the first bit, the (n−3)th bit, . . . are placed from the bottom upward as is viewed from the figure, in correspondence with the order of arrangement of the interconnection lines described above. In this order of arrangement of the terminals, the terminals 50$t$(0) and 50$t$(1) for the 0-th and first bits continuous from the least significant position are located on the inner sides of the terminals 50$t$(n) and 50$t$(n−1) for the n-th and (n−1)th bits, for example, continuous from the most significant position. And, the terminals 50$t$(0) and 50$t$(1) for the 0-th and first bits are located on the outer sides of the terminals 50$t$(n−2) and 50$t$(n−3) for the (n−2)th and (n−3)th bits, for example, continuous from the most significant position.

Thus, in this embodiment, as in Embodiment 10, automatic layout of the interconnection lines 10 and 20 for lower-order and higher-order bits in the order of arrangement described above, not in the ascending or descending order of bits, is possible without the necessity of design change of the auto placing and routing tool.

Embodiment 12

A functional macro of Embodiment 12 of the present invention will be described with reference to FIG. 12.

Figure 12:
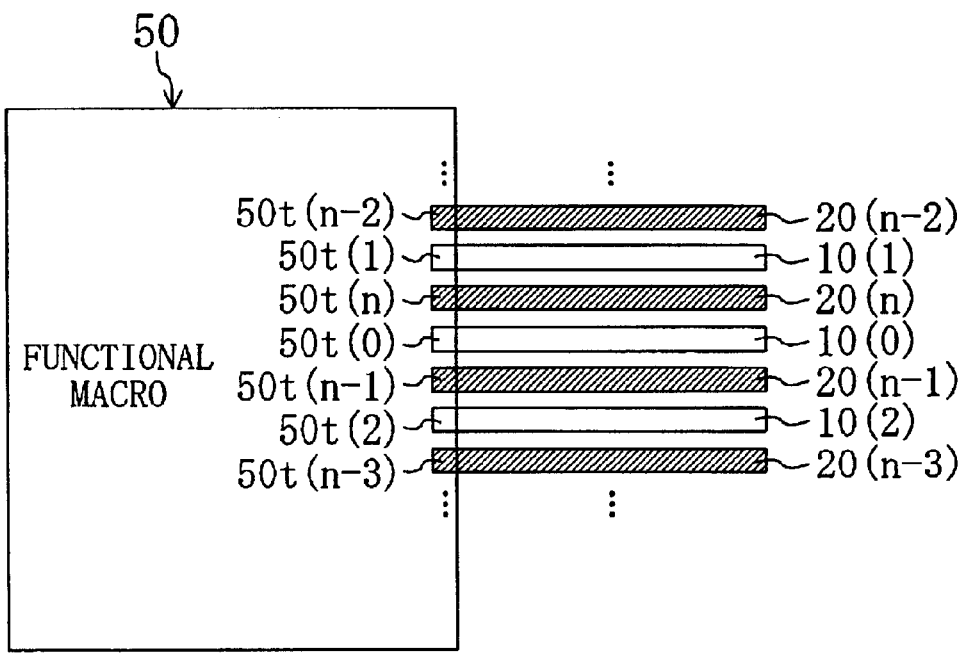
FIG. 12 is a block diagram of a functional macro of Embodiment 12 of the present invention.

In this embodiment, referring to FIG. 12, the interconnection line 10(0) for the 0-th bit as the least significant bit is placed at the center position, and the interconnection lines 20($n$) and 20($n$−1) for the n-th bit and the (n−1)th bit as the two highest-order bits are placed sandwiching the interconnection line 10(0). The interconnection lines 10(1) and 10(2) for the first and second bits as the remaining two lowest-order bits are placed on the outer sides of the interconnection lines 20($n$) and 20($n$−1). In this way, the interconnection lines for the remaining two highest-order bits and the interconnection lines for the remaining two lowest-order bits are repeatedly placed on the outer sides of the previously-placed interconnection lines sides alternately to finally complete placement of all the interconnection lines.

For layout of the plurality of interconnection lines in the order of arrangement described above, the functional macro 50 is used. In the functional macro 50, the terminals 50$t$(0), 50$t$(n), 50$t$(1), 50$t$(n−2), . . . for the 0-th bit, the nth bit, the first bit, the (n−2)th bit, . . . are placed from the center upward as is viewed from the figure and the terminals 50$t$(n−1), 50$t$(2), 50$t$(n−3), . . . for the (n−1)th bit, the second bit, the (n−3)th bit, . . . are placed from the center downward as is viewed from the figure, in correspondence with the order of arrangement of the interconnection lines described above.

Thus, in this embodiment, as in Embodiment 11, by using the functional macro in which the terminals 50$t$($n$) to 50$t$(0) are placed in an order based on the signal change frequency, automatic layout of the interconnection lines 10 and 20 for lower-order and higher-order bits in the order of arrangement described above, not in the ascending or descending order of bits, is possible without the necessity of design change of the auto placing and routing tool.

Embodiment 13

A functional macro of Embodiment 13 of the present invention will be described with reference to FIGS. 13A and 13B.

Figure 13A:
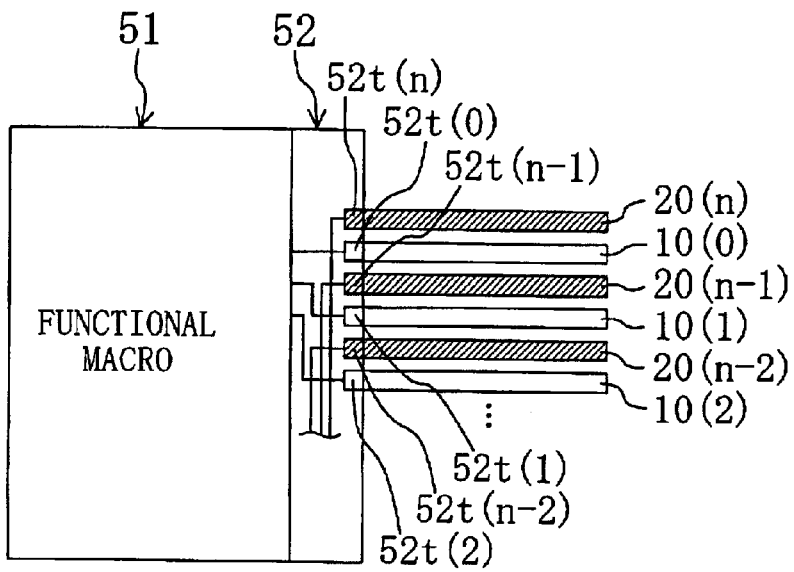
FIG. 13A is a block diagram of a functional macro of Embodiment 13 of the present invention.

As shown in FIG. 13A, a terminal sorting block 52 for changing the order of arrangement of terminals is provided next to an existing functional macro 51. The functional macro 51, which may be an SRAM, an operator, a CPU or the like, includes a plurality of terminals placed in the ascending (or descending) order of bits although not shown.

In this embodiment, the order of arrangement of interconnection lines is the same as that in Embodiment 10. That is, the interconnection lines 20($n$), 20($n$−1), 20($n$−2), for the n-th bit as the most significant bits, the (n−1)th bit, the (n−2)th bit, . . . are placed in the descending order from the top downward as is viewed from the figure at a spacing double a normal wiring spacing, and the interconnection lines 10(0), 10(1), 10(2), . . . for the 0-th bit as the least significant bit, the first bit, the second bit, . . . are placed in the ascending order from the top downward as is viewed from the figure between the interconnection lines 20($n$), 20($n$−1), . . . for the higher-order bits.

Figure 13B:
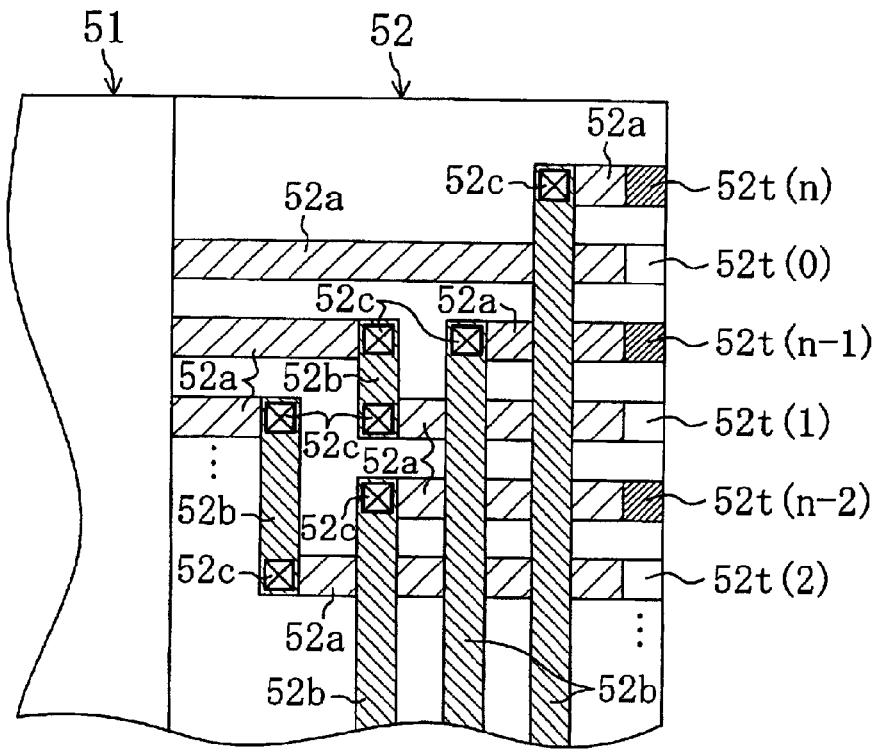
FIG. 13B is an enlarged view showing in detail part of a terminal sorting block disposed next to the functional macro.

The terminal sorting block 52 has the same width as the functional macro 51 in the direction in which the interconnection lines 20($n$) to 10(0) are arranged, and, as shown in detail in the enlarged view of FIG. 13B, provides a plurality of new terminals 52$t$(n), 52$t$(0), 52$t$(n−1), 52$t$(1), 52$t$(n−2), 52$t$(2), . . . placed in the order of the n-th bit as the most significant bit, the 0-th bit as the least significant bit, the (n−1)th bit, the first bit, the (n−2)th bit, the second bit, from the top downward as is viewed from the figure, in correspondence with the order of arrangement of the interconnection lines described above.

The terminal sorting block 52 further includes a plurality of interconnection lines 52$a$ running laterally as is viewed from the figure in a first metal wiring layer (aluminum layer), a plurality of interconnection lines 52$b$ running vertically as is viewed from the figure in a second metal wiring layer (aluminum layer), and a plurality of vias 52$c$ for coupling the first and second wiring layers for connection of the interconnection lines 52$a$ and 52$b$. Through these interconnection lines 52$a$ and 52$b$ and the vias 52$c$, the terminals (not shown) placed in a first layer of the existing functional macro 51 in the ascending or descending order of bits are connected to the terminals 52$t$(n) to 52$t$(0) of the terminal sorting block 52, whereby the order of arrangement of the terminals is changed. The terminal sorting block 52 having the terminals 52$t$(n) to 52$t$(0) is formed integrally with the functional macro 51.

The terminal sorting block 52 may be made shorter or longer in width than the functional macro 51. The terminal sorting block 52 may not include the terminals 52$t$(n) to 52$t$(0), but may be constructed of only the interconnection lines 52$a$ and 52$b$ and the vias 52$c$. In the case of not including the terminals, the terminal sorting block 52 is desirably disposed between the functional macro 51 and the terminals 52$t$(n) to 52$t$(0), but is not limited to this position.

Thus, in this embodiment, by only providing the terminal sorting block 52 next to the functional macro 51, the existing functional macro 51 can attain arrangement of terminals similar to that of the novel functional macros 50 shown in FIGS. 9 to 12 in which the order of arrangement of terminals have been changed as desired. Therefore, once an auto placing and routing tool grasps the order of arrangement of the terminals 52$t$($n$) to 52$t$(0) of the terminal sorting block 52, automatic layout of the plurality of interconnection lines 20(*n*) to 10(0) in a predetermined order of arrangement is possible using the auto placing and routing tool. No design change is required for the auto placing and routing tool.

In this embodiment, the order of arrangement of the interconnection lines and the terminals described in Embodiment 10 was adopted. Naturally, substantially the same function and effect can also be obtained by adopting the order of arrangement of the interconnection lines and the terminals described in Embodiment 9, 11 or 12.

In this embodiment, the terminal sorting block 52 was provided for the existing functional macro 51. In design of a new functional block, the terminal sorting block 52 may be incorporated in the functional macro designed. The positions of the terminals and the terminal sorting block 52 may be anywhere in the functional macro.

Embodiment 14

A semiconductor integrated circuit of Embodiment 14 of the present invention will be described with reference to FIG. 14. In this embodiment, a plurality of terminals of a functional macro are placed, not at equal spacing, but at different spacing.

Figure 14:
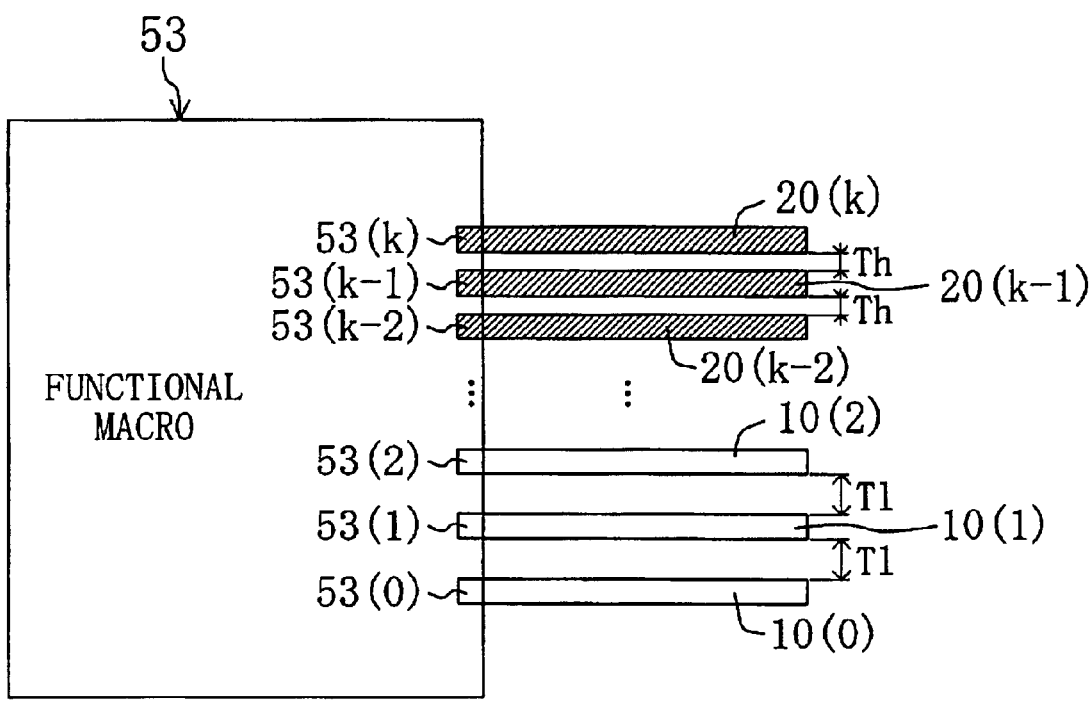
FIG. 14 is a block diagram of a functional macro of Embodiment 14 of the present invention.

Referring to FIG. 14, the interconnection lines 10(0) to 20(*k*) are placed in the order described in Embodiment 1 shown in FIG. 1, that is, in the ascending order from the interconnection line 10(0) for the least significant bit (or in the descending order from the interconnection line 20(*k*) for the most significant bit). The spacing between the interconnection lines 20(*k*), 20(*k*–1), . . . for the higher-order bits is set at a predetermined spacing Th, while the spacing between the interconnection lines 10(0), 10(1), . . . for the lower-order bits is set at a spacing T1 larger than the predetermined spacing Th.

A functional macro 53 is used for the placement of the interconnection lines 10(0) to 20(*k*) at the spacing described above. The functional macro 53 has terminals 53(0) to 53(*k*) to which the above interconnection lines are respectively connected. The terminals 53(0) to 53(*k*) are placed in the descending order from the bottom (or in the ascending order from the top) as is view from the figure. The spacing between the terminals 53(0), 53(1), . . . to which the interconnection lines 10(10), 10(1), . . . for the lower-order bits are connected is equal to the large spacing T1, while the spacing between the terminals 53(*k*), 53(*k*–1), . . . to which the interconnection lines 20(*k*), 10(*k*–1), . . . for the higher-order bits are connected is equal to the predetermined spacing Th.

Thus, in this embodiment, once an auto placing and routing tool grasps the positions of the terminals 53(0) to 53(*k*) of the functional macro 53, automatic layout of the interconnection lines 10(0) to 20(*k*) in the ascending (or descending) order at the spacings T1 and Th is possible using the auto placing and routing tool. No design change is required for the auto placing and routing tool.

Embodiment 15

A semiconductor integrated circuit of Embodiment 15 of the present invention will be described with reference to FIG. 15.

Figure 15:
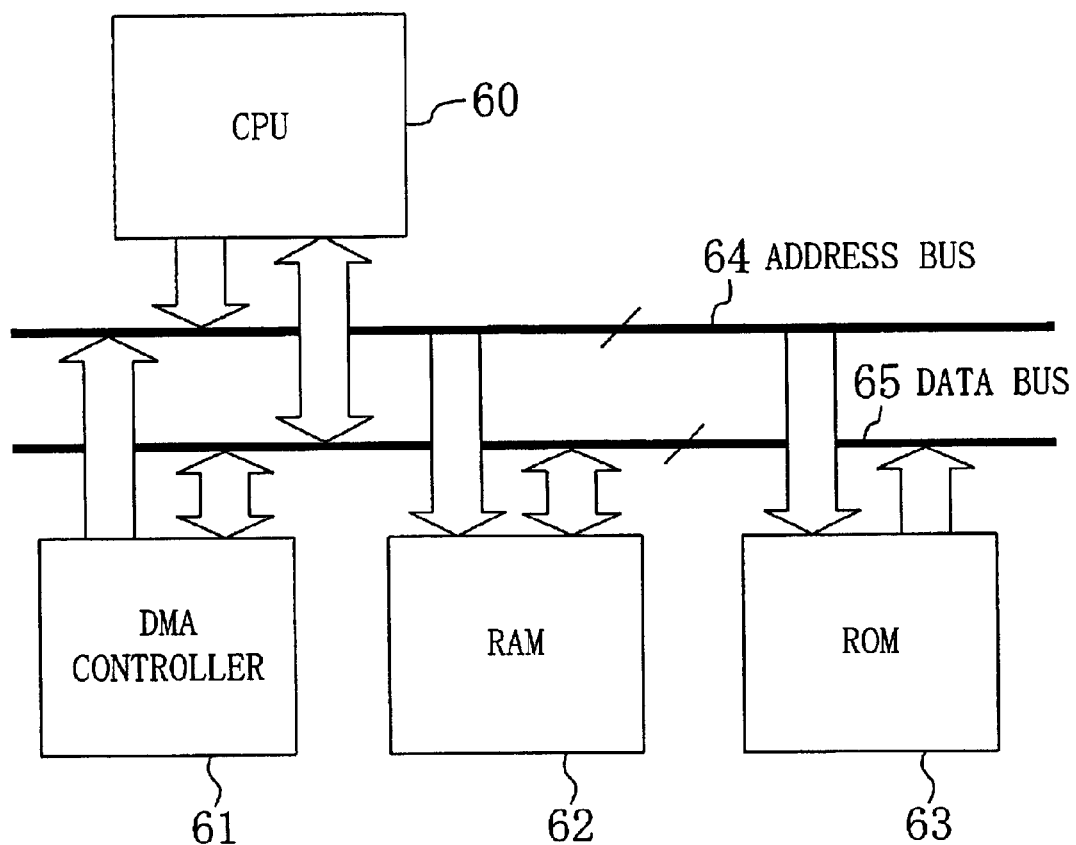
FIG. 15 is a block diagram of a semiconductor integrated circuit of Embodiment 15 of the present invention.

The semiconductor integrated circuit of FIG. 15 is a microprocessor, which includes a CPU 60, a DMA controller 61 performing data transfer without intervention of the CPU 60, a RAM 62, a ROM 63, an address bus 64 for a plurality of bits, and a data bus 65 for a plurality of bits. The address bus 64 and the data bus 65 are used for data transfer between the CPU 60 and the RAM 62 or the ROM 63 and data transfer between the DMA controller 61 and the RAM 62 or the ROM 63.

In this embodiment, the configuration of the functional macro 50 shown in FIG. 9 is adopted for the CPU 60, the DMA controller 61, the RAM 62 and the ROM 63. In other words, the order of arrangement of a plurality of address terminals of each of the CPU 60, the DMA controller 61, the RAM 62 and the ROM 63 is set to conform to the order of arrangement of the terminals 50(*h*) and 50(1) of the functional macro 50 shown in FIG. 9. The order of arrangement of the address terminals is not limited to that of terminals 50(*h*) and 50(1) of the functional macro 50 shown in FIG. 9, but the order of arrangement of the terminals 50*t*(n) to 50*t*(0) of the functional macro 50 shown in FIG. 10, 11 or 12, or the order of arrangement of the terminals 52*t*(n) to 52*t*(0) of the terminal sorting block 52 shown in FIG. 13 may be adopted.

In this embodiment, therefore, the following function is attained. In the access from the CPU 60 or the DMA controller 61 to the RAM 62 or the ROM 63, continuous addresses are designated in many cases, and thus on the address bus 64, lower-order bits are changed more frequently than higher-order bits. In the CPU 60, the DMA controller 61, the RAM 62 and the ROM 63 adopting the order of arrangement of the terminals of the functional macro 50 shown in FIG. 9, lines of the address bus 64 for lower-order bits having a high signal change frequency are sandwiched by lines thereof for higher-order bits having a low signal change frequency, so that the lines for higher-order bits serve as shields. It is therefore possible to effectively suppress increase in delay in signal propagation due to interference of signals between adjacent two bus lines.

Moreover, once an auto placing and routing tool grasps the order of arrangement of the address terminals of the CPU 60, the DMA controller 61, the RAM 62 and the ROM 63, automatic layout of the order of arrangement of the lines of the address bus 64 is possible from the order of arrangement of the address terminals of the CPU 60 and the like using the auto placing and routing tool. No design change is required for the auto placing and routing tool.

Embodiment 16

A semiconductor integrated circuit of Embodiment 16 of the present invention will be described with reference to FIG. 16.

Figure 16:
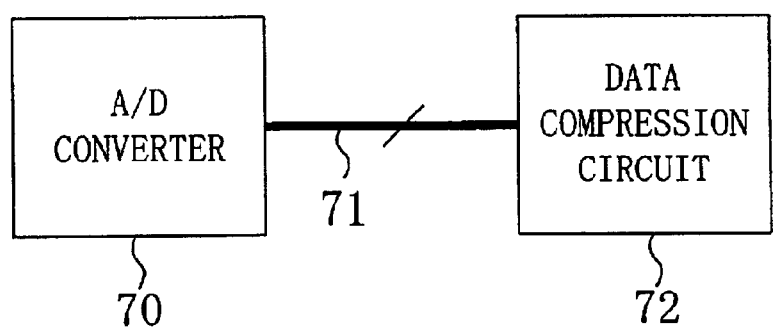
FIG. 16 is a block diagram of a semiconductor integrated circuit of Embodiment 16 of the present invention.
Figure 17:
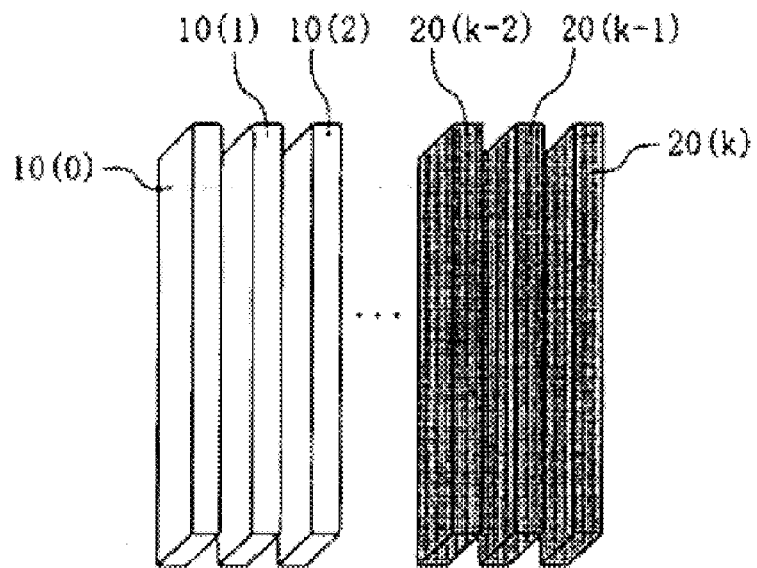
FIG. 17 is a diagrammatic illustration of a conventional wiring method.
Figure 18:
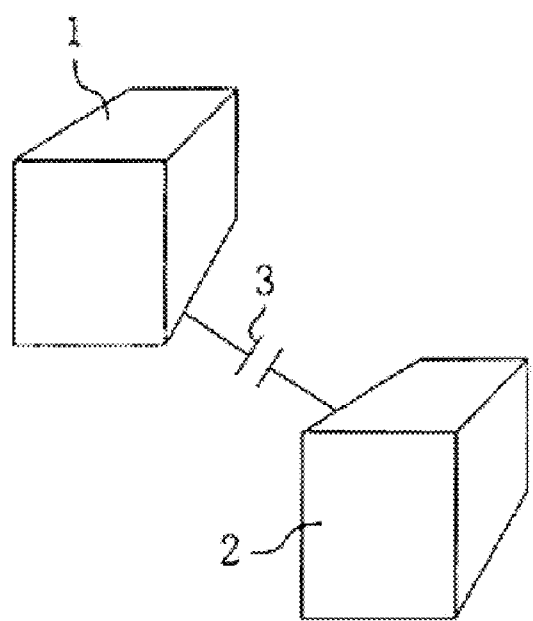
FIG. 18 is a diagrammatic illustration of a capacitance between interconnection lines.

The semiconductor integrated circuit shown in FIG. 16 is part of a circuit for storing audio information such as music in the MP3 (MPEG-1 Audio Layer III) format. In the illustrated example, audio information as an analog signal is converted to a digital signal by an A/D converter 70. The converted digital signal is input into a data compression circuit 72 via a data signal interconnection 71 for a plurality of bits. The data compression circuit 72 compresses the received digital signal in the MP3 format.

In this embodiment, a plurality of data output terminals of the A/D converter 70 and a plurality of data input terminals of the data compression circuit 72, both connected to lines of the data signal interconnection 71, adopt the order of arrangement of the terminals 50(*h*) and 50(1) of the functional macro 50 shown in FIG. 9, for example. The order of arrangement of the plurality of lines of the data signal interconnection 71 adopts the order of arrangement of the interconnection lines 10 and 20 shown in FIG. 9, for example.

A digital signal of a plurality of bits on the data signal interconnection 71 maintains the continuity of the analog signal from which the digital signal was converted by the A/D converter 70, and thus lower-order bits are changed more frequently than higher-order bits. In this embodiment, the plurality of lines of the data signal interconnection 71 are placed in the order conforming to that of the interconnection lines 10 and 20 shown in FIG. 9, where the interconnection lines for lower-order bits having a high signal change frequency are sandwiched by interconnection lines for high-order bits having a low signal change frequency, so that the interconnection lines for higher-order bits serve as shields for the interconnection lines for lower-order bits. Thus, in this embodiment, increase in delay in signal propagation on the data signal interconnection 71 is effectively suppressed.

Moreover, the plurality of terminals of the A/D converter 70 and those of the data compression circuit 72 are placed in advance in the order identical to the order of arrangement of the lines of the data signal interconnection 71. Once an auto placing and routing tool stores the order of arrangement of the terminals, automatic layout of the lines of the data signal interconnection 71 in the order of arrangement described above is possible by the auto placing and routing tool. No design change is required for the auto placing and routing tool.

As the order of arrangement of the terminals of the A/D converter 70 and those of the data compression circuit 72, it is possible to adopt the order of arrangement of the terminals 50$t$(n) to 50$t$(0) of the functional macro 50 shown in FIG. 10, 11 or 12, or the order of arrangement of the terminals 52$t$(n) to 52$t$(0) of the terminal sorting block 52 shown in FIG. 13. As the order of arrangement of the lines of the data signal interconnection 71, it is possible to adopt the order of arrangement of the interconnection lines 20($n$) to 10(0) shown in FIG. 10, 11 or 12.

The present invention was applied to the order of arrangement of lines of the address bus 64 in Embodiment 15 and the data signal interconnection 71 in Embodiment 16. When there exist a plurality of interconnection lines in addition to the bus 64 or the signal interconnection 71, those having a low signal change frequency among these interconnection lines may be interposed between the lines of the address bus 64 or the data signal interconnection 71 for lower-order bits having a high signal change frequency. This is also within the scope of the present invention.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. A wiring method for placing interconnection lines for a plurality of bits in parallel two-dimensionally or three-dimensionally in layout design of a semiconductor integrated circuit,
    wherein the interconnection lines for a plurality of bits are placed in an ascending or descending order of the bits,
    interconnection lines for bits of ordinal numbers equal to or more than a predetermined ordinal number are placed adjacent to each other at a predetermined spacing, and
    interconnection lines for bits of ordinal numbers less than the predetermined ordinal number are placed adjacent to each other at a spacing exceeding the predetermined spacing.

2. A wiring method for placing interconnection lines in parallel two-dimensionally or three-dimensionally in layout design of a semiconductor integrated circuit,
    wherein a signal change frequency at which a signal propagating through an interconnection line changes per unit time is determined for each of the plurality of interconnection lines by estimation or simulation, and
    the plurality of interconnection lines are placed based on the signal change frequency so that interconnection lines having a high signal change frequency and interconnection lines having a low signal change frequency are adjacent to each other.

3. The method of claim 2, wherein, in the case of transmitting a signal of a plurality of bits via the plurality of interconnection lines, the plurality of interconnection lines are placed based on the signal change frequency, irrespective of an ascending or descending order of the bits.

4. The method of claim 2, wherein the plurality of interconnection lines are placed so that interconnection lines having a high signal change frequency are sandwiched by interconnection lines having a low signal change frequency.

5. A wiring method for placing interconnection lines for a plurality of bits in parallel two-dimensionally or three-dimensionally in layout design of a semiconductor integrated circuit,
    wherein in placement of the interconnection lines for a plurality of bits, one interconnection line for a bit of an ordinal number equal to or more than a predetermined ordinal number and an interconnection line for a bit of an ordinal number less than the predetermined ordinal number are placed adjacent to each other, and
    another interconnection line for a bit of an ordinal number equal to or more than the predetermined ordinal number and another interconnection line for a bit of an ordinal number less than the predetermined ordinal number are placed adjacent to each other, and this placement is repeated.

6. The method of claim 5, wherein interconnection lines for bits are placed in a descending order from the most significant bit until a bit of the predetermined ordinal number in parallel two-dimensionally at a spacing double a predetermined spacing, and
    interconnection lines for bits are placed in an ascending order from the least significant bit in parallel two-dimensionally between the already-placed interconnection lines.

7. The method of claim 5, wherein the method comprises the steps of:
    (1) placing an interconnection line for the least significant bit at a predetermined position;
    (2) placing interconnection lines for the two highest-order bits on the right and left sides of the interconnection line for the least significant bit;
    (3) placing interconnection lines for the remaining two lowest-order bits on the right and left sides of the interconnection lines for the two highest-order bits placed in the step (2);
    (4) placing interconnection lines for the remaining two highest-order bits on the right and left sides of the interconnection lines for the two lowest-order bits placed in the step (3); and
    (5) repeating the steps (3) and (4) until the interconnection lines for all the bits are placed.

8. A wiring method for placing interconnection lines for a plurality of bits in parallel three-dimensionally in n wiring layers (n>2) in layout design of a semiconductor integrated circuit, the method comprising the steps of:

(1) placing an interconnection line for the least significant bit in a predetermined wiring layer;

(2) placing interconnection lines for a plurality of highest-order bits in the same wiring layer as the interconnection line for the least significant bit and a different wiring layer so as to surround the interconnection line for the least significant bit placed in the step (1);

(3) placing interconnection lines for a plurality of remaining lowest-order bits in the same wiring layers as the interconnection lines for a plurality of highest-order bits and a different wiring layer so as to surround the interconnection lines for a plurality of highest-order bits placed in the step (2); and (4) repeating the steps (2) and (3) until the interconnection lines for all the bits are placed.

9. The method of claim 8, wherein the n wiring layers are two wiring layers, the interconnection line for the least significant bit is placed at a predetermined position of the lower wiring layer in the step (1), interconnection lines for the three highest-order bits are placed in the lower and upper wiring layers so as to be positioned on the right, left and upper sides of the interconnection line for the least significant bit in the step (2);

interconnection lines for the remaining four lowest-order bits are placed in the lower and upper wiring layers so as to be positioned on the right and left sides of the interconnection lines for the three highest-order bits in the step (3), and the steps (2) and (3) are repeated until the interconnection lines for all the bits are placed in the step (4).

10. The method of claim 8, wherein the n wiring layers are two wiring layers, the interconnection line for the least significant bit is placed at a predetermined position of the upper wiring layer in the step (1), interconnection lines for the three highest-order bits are placed in the upper and lower wiring layers so as to be positioned on the right, left and lower sides of the interconnection line for the least significant bit in the step (2);

interconnection lines for the remaining four lowest-order bits are placed in the upper and lower wiring layers so as to be positioned on the right and left sides of the interconnection lines for the three highest-order bits in the step (3), and the steps (2) and (3) are repeated until the interconnection lines for all the bits are placed in the step (4).

11. The method of claim 8, wherein the n wiring layers are three wiring layers, the interconnection line for the least significant bit is placed at a predetermined position of the center wiring layer in the step (1), interconnection lines for the four highest-order bits are placed in the center, lower and upper wiring layers so as to be positioned on the right, left, upper and lower sides of the interconnection line for the least significant bit in the step (2);

interconnection lines for the remaining six lowest-order bits are placed in the center, lower and upper wiring layers so as to be positioned on the right and left sides of the interconnection lines for the four highest-order bits in the step (3), interconnection lines for the remaining six highest-order bits are placed in the center, lower and upper wiring layers so as to be positioned on the right and left sides of the interconnection lines for the six lowest-order bits in the step (4), and the steps (3) and (4) are repeated until the interconnection lines for all the bits are placed.

* * * * *